Figure 1:
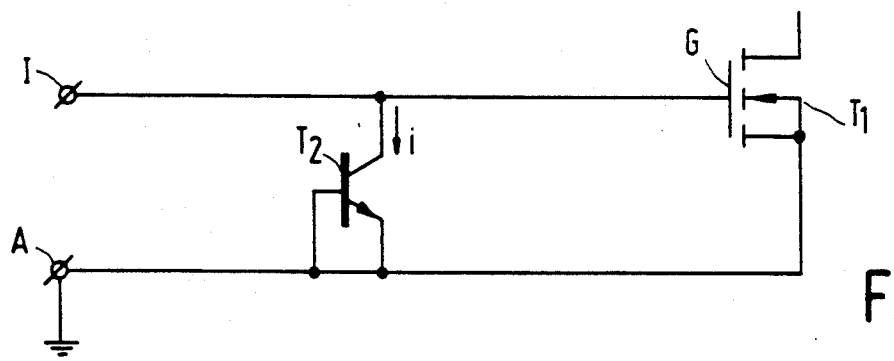

United States Patent [19]
Van Roozendaal et al.

[11] Patent Number: 5,225,896
[45] Date of Patent: Jul. 6, 1993

[54] PROTECTION ELEMENT AND METHOD OF MANUFACTURING SAME

[75] Inventors: Leonardus J. Van Roozendaal, Eindhoven, Netherlands; Samuel J. S. Nagalingam, San Antonio, Tex.

[73] Assignee: U.S. Philips Corporation, New York, N.Y.

[21] Appl. No.: 741,983

[22] Filed: Aug. 6, 1991

Related U.S. Application Data

[63] Continuation of Ser. No. 470,183, Jan. 25, 1990, abandoned.

[30] Foreign Application Priority Data

Feb. 1, 1989 [NL] Netherlands .................... 8900239

[51] Int. Cl.⁵ .................. H01L 29/06; H01L 29/78; H01L 27/02
[52] U.S. Cl. .................. 257/356; 257/546; 257/384
[58] Field of Search ............. 357/71, 7.15, 51, 23.13, 357/35, 67

[56] References Cited

U.S. PATENT DOCUMENTS

| | | | |
|---|---|---|---|
| 4,675,073 | 6/1987 | Douglas | 156/643 |
| 4,697,199 | 9/1987 | De Graaf et al. | 357/23.13 |
| 4,860,086 | 8/1989 | Nakamura et al. | 357/67 |
| 4,874,717 | 10/1989 | Neppl et al. | 437/59 |
| 4,927,775 | 5/1990 | Alvarez et al. | 437/31 |

FOREIGN PATENT DOCUMENTS 0112034  3/1982  European Pat. Off. ......... 357/23.14

*Primary Examiner*—Jerome Jackson, Jr.
*Assistant Examiner*—D. Monin
*Attorney, Agent, or Firm*—Paul R. Miller

[57] ABSTRACT

A semiconductor device comprises a semiconductor body (1) of silicon having a monolithic integrated circuit with a field oxide pattern (2) having at least one protection element (T2) having at least one active zone (4) of a first conductivity type, which adjoins at least in part the field oxide (2) and forms with the adjoining silicon region (5) of the second opposite conductivity type a pn junction (6). The active zone (4) is contacted with an electrode layer (7), which is connected to a point (G) of the semiconductor device to be protected against static discharge. The electrode layer (7) consists of a metal silicide. According to the invention, the metal silicide (7) also extends onto the field oxide (2) adjoining the active zone (4) over a certain distance, which is preferably at least 0.5 μm.

7 Claims, 2 Drawing Sheets

PROTECTION ELEMENT AND METHOD OF MANUFACTURING SAME

This is a continuation of application Ser. No. 07/470,183, filed Jan. 25, 1990 now abandoned.

The invention relates to a semiconductor device comprising a semiconductor body of silicon having a monolithic integrated circuit with a field oxide pattern having at least one protection element comprising at least one active zone of a first conductivity type, which adjoins at least in part the field oxide and forms a pn junction with the adjoining silicon region of the second opposite conductivity type, this active zone being contacted with an electrode layer connected to a connection conductor of the circuit of the semiconductor device to be protected against static discharge, while the electrode layer comprises metal silicide.

Such a semiconductor device is described inter alia in the article "Electrical Overstress in NMOS Silicided Devices" by D. J. Wilson et al in EOS/ESD Symposium Proceedings, Sep. 29 to Oct. 1, 1987, pp. 265-273.

Integrated circuits can often be subjected during their manufacture and treatment to electrostatic charges, which — and this applies especially to MOS and CMOS circuits having a high packing density and very thin gate oxide layers — can damage the circuit irreparably. This phenomenon is mostly designated in the literature by the abbreviation ESD (=ElectroStatic Discharge). For protection against these discharge phenomena, protection elements or protection circuits are usually included in the circuits, which have for their object to drain electrostatic charge, which is obtained, for example, by friction during the manipulation, by-passing the actual circuit. In this case, the speed at which this takes place and the threshold voltage at which the protection element becomes operative are especially important. As protection elements, use is frequently made of lateral transistors or the parasitic lateral transistors of MOS transistors or transistors or diodes.

In advanced integrated circuits according to submicron technology having a high packing density, in which a low contact resistance especially at source and drain regions and gate electrodes is of major importance, these regions are contacted by means of self-aligned processes, in which the contact is formed by means of a metal silicide. These processes, in which a metal is provided throughout the surface, and then reacts with the exposed silicon by heating to form a metal silicide, are known as "salicide" (short for self-aligned silicide) techniques. Preferably, as silicide, use is made of titanium silicide (TiSi$_2$) because this material has a very low electrical resistance, has a high temperature stability, and has the capability of reducing silicon oxide so that the titanium-silicon reaction cannot be hindered by an oxide film.

However, it has been found that, when for the protection elements use is also made of these salicide processes, the protection properties are strongly adversely affected. See in this connection, for example, the aforementioned article by Wilson et al, p. 272, in which it is ascertained, that, for the aforementioned reasons, silicide processes should be avoided in protection systems. However, this results in a further complication of the already complicated process, and therefore, it would be very desirable if the protection elements could be manufactured simultaneously with the remaining part of the circuit while using the same technology.

The invention has inter alia for its object to provide a semiconductor device and a method of manufacturing same, in which protection elements can be manufactured without additional processing steps during the same process as remaining parts of the integrated circuit.

The invention is based inter alia on recognition of the fact that the problems described above are due, at least to a considerable extent, to the fact that the interface between the metal silicide and the adjoining silicon substrate has an irregular shape in the usual method of manufacturing.

According to the invention, a semiconductor device of the kind described in the opening paragraph is characterized in that the metal silicide also extends over a certain distance onto the field oxide adjoining the active zone. Preferably, this distance is at least 0.5 μm.

The invention further relates to a method of manufacturing the device. This method is characterized in that a silicon substrate is provided with a field oxide pattern, in that then the active zone is formed in a selfregistered manner by implantation of doping ions, in that subsequently a metal layer and a layer of amorphous silicon are successively provided, after which a pattern is etched from the amorphous silicon, which pattern extends over a distance of at least 0.5 μm both above the active zone and above the adjoining field oxide, in that then the amorphous silicon and the underlying metal are converted entirely and the uncovered metal lying on the monocrystalline substrate is converted at least in part into metal silicide, after which the metal not converted into silicide is removed, and in that subsequently the contact windows and the metallization are provided.

In order to obtain an optimum result, the pattern of amorphous silicon preferably extends over a distance of at least 0.5 μm onto the active zone and onto the adjoining field oxide.

Although other metals forming a suitable metal silicide, such as, for example, cobalt, could also be used, a preferred embodiment of the invention is characterized in that a titanium layer is provided as the metal layer, in that after the amorphous silicon has been provided by heating in a nitrogen atmosphere, the uncovered titanium present on the field oxide is converted into titanium nitride and the amorphous silicon with the subjacent titanium is converted into titanium silicide, after which the titanium nitride is removed by means of an etching liquid, and in that then a second heat treatment is carried out at a higher temperature in order to convert the titanium silicide into the desired crystal form.

At the areas at which amorphous silicon was provided on the metal, preferably titanium, the titanium and amorphous silicon are converted into titanium silicide. Thus, titanium silicide is also formed on the field oxide adjoining the active zone. Due to the fact that at the areas at which titanium is disposed directly on the monocrystalline silicon the latter reacts considerably more slowly with the titanium than the amorphous silicon disposed on the titanium, the titanium silicide boundary in the active zones of the protection elements lies at a much smaller depth than in processes in which no amorphous silicon is provided on the titanium, and this boundary is much more regular. Moreover, the distance of the silicide from the pn junction increases, which leads to a higher series resistance of the protection element. Both effects contribute to avoiding the occurrence of undesired current concentrations, as will be explained more fully hereinafter.

It should be noted that it is known per se to form electrically conducting titanium silicide compounds on oxide by covering the metal with amorphous silicon; see, for example, the article "Self-aligned $TiSi_2$ for submicron CMOS" by A. G. M. Jonkers et al in "Le vide-/Les couches minces", Vol. 42, No. 236, March/April 1987, pp. 103-105. In this article, this technique is used solely for forming connections over the oxide. However, no mention is made therein of an application in the manufacture of protection elements, or of the advantage of the smaller penetration depth of the silicide into monocrystalline silicon, particularly with respect to the properties of protection elements.

Figure 2:
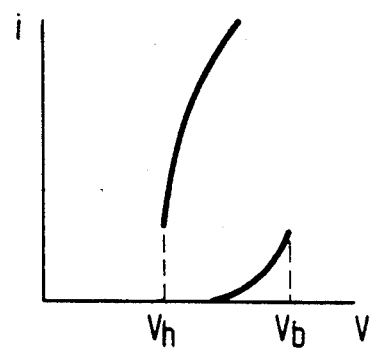
Figure 3:
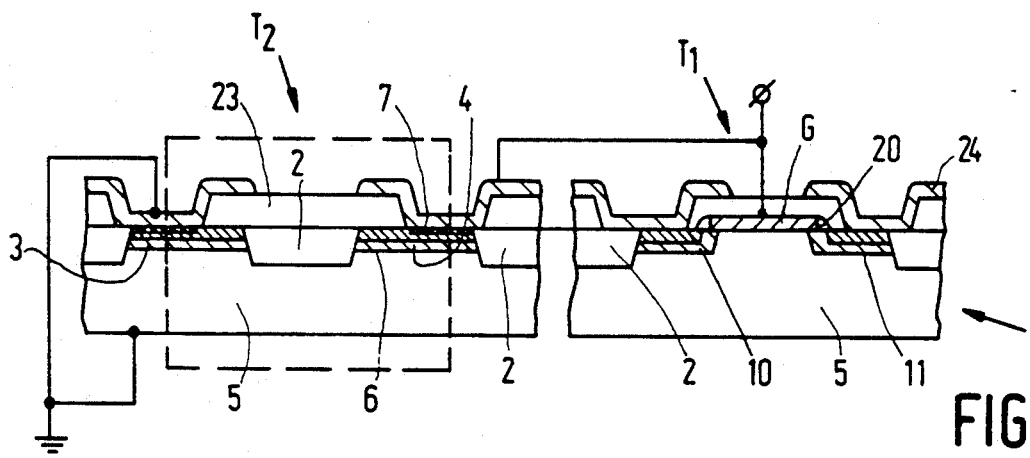
Figure 4:
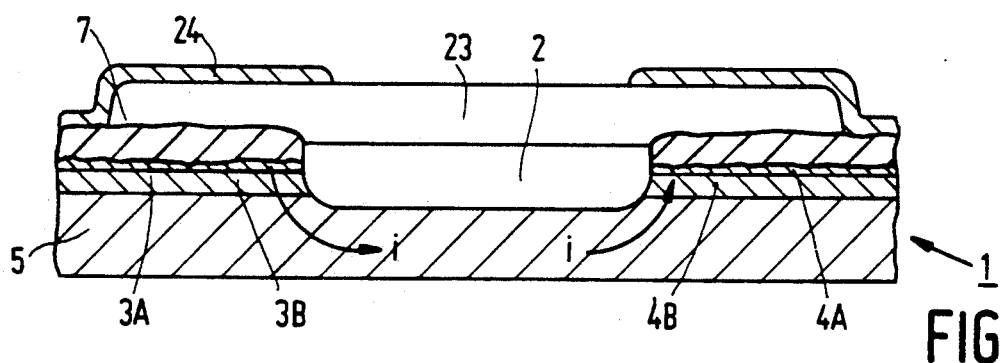
Figure 5:
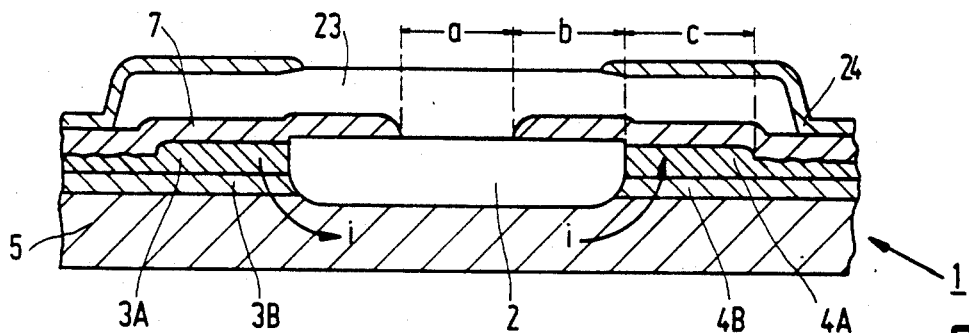
Figure 6:
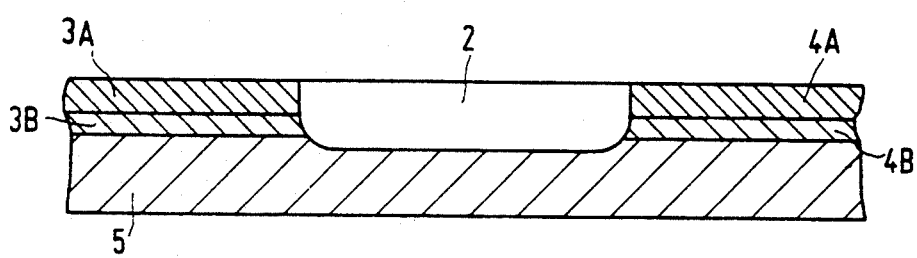

The invention will now be described more fully with reference to an embodiment and the drawing, in which:

FIG. 1 shows a circuit diagram of the input part of a semiconductor device comprising a protection element according to the invention, FIG. 2 shows a current-voltage characteristic of the protection element of the device shown in FIG. 1, FIG. 3 shows diagrammatically a cross-section of the device shown in FIG. 1, FIG. 4 shows diagrammatically a cross-section of a part of a protection element according to the standard technique, FIG. 5 shows diagrammatically a cross-section of a part of the protection element according to the invention, and FIGS. 6, 7, 8 and 9 show cross-sections of the element shown in FIG. 5 at successive stages of manufacture.

The Figures are schematic and not drawn to scale. Corresponding parts are generally designated by the same reference numerals. In the cross-sections, semiconductor regions of the same conductivity type are cross-hatched in the same direction.

FIG. 1 shows a circuit diagram of a part (the input part) of a semiconductor device comprising a protection circuit according to the invention. The device comprises an integrated circuit, in which in FIG. 1 (right-hand side) only one insulated gate field effect transistor T1, such as a MOS transistor, is shown. This transistor, in this embodiment an N-channel or NMOS transistor, is electrically connected to a number of further circuit elements, which, however, are not essential to the invention and are therefore not shown in the drawing.

The gate electrode G of the NMOS transistor T1 is connected to an input I of the circuit. At this input I, an electrostatic charge can be formed, which, when it would be discharged through the transistor T1, could irreparably damage the circuit.

In order to avoid this, a protection element is provided, which in this embodiment consists of a bipolar npn transistor T2, whose emitter and base are connected to a ground reference potential terminal A, which is connected, for example, to ground. The collector of transistor T2 is connected to the input I of the circuit. The current voltage characteristic i-V of the transistor T2 is shown diagrammatically in FIG. 2. When a high voltage V is applied to the input I such that the avalanche breakdown voltage Vb is exceeded, the current i rapidly increases, whereas the voltage across T2 strongly decreases, which phenomenon is known under the designation "snap-back". The electrostatic charge at the input is drained to ground via the transistor T2 without the risk of damaging the circuit.

FIG. 3 shows diagrammatically in cross-section a practical embodiment of a semiconductor device in which the invention can be accomplished. The device comprises a semiconductor body 1 of monocrystalline silicon having a monolithic integrated circuit, of which in FIG. 3 only the MOS transistor T1 is also shown. The device comprises a field oxide pattern, in this embodiment a pattern of sunken oxide 2 (LOCOS), but this is not necessary and any form of sunken or non sunken field oxide may be used. The protection element, which in this embodiment is a bipolar lateral npn transistor T2, comprises two active zones 3 and 4 of one conductivity type, which in this embodiment constitutes the conductivity type of the emitter zone and the collector zone, respectively, of T2. The zones 3 and 4 both adjoin the field oxide 2 as well as the adjacent silicon region 5 of the second opposite conductivity type, which in this embodiment may be the p-conductivity type. This region 5 may be constituted by the substrate itself or, for example, by an epitaxial layer present on the substrate. Both zones 3 and 4 form a pn junction with the region 5, the pn junction 6 between the collector zone 4 and the region 5 being biased in the reverse direction in the operating condition at least temporarily for elimination of electrostatic charge at the input I. It is further indicated in the drawing that the active zones 3 and 4, like the source and drain zones 10 and 11 of the MOS transistor T1, consist of more highly doped first regions 3A, 4A and more weakly doped second regions 3B, 4B, which adjoin the "first" regions. This measure serves to prevent injection of "hot" charge carriers into the gate electrodes of the MOS transistors, but is not essential to the invention.

The active zone 4 is contacted (on the part 4A) with an electrode layer 7, which is connected to a point of the semiconductor device to be protected against static discharge, in this case the gate electrode G of T1. This electrode layer 7 consists mostly of a metal silicide and in this embodiment, may be titanium silicide.

FIG. 4 shows in a greater detail the part of FIG. 3 within the dotted line as appears in the prior art. The situation is shown therein, which arises when the metal silicide is provided in a normal or usual manner in the salicide technology. It clearly appears from FIG. 4 that the transition between the titanium silicide 7 and the silicon 3, 4 causes the series resistance in the current path through the region 4A to vary strongly and moreover to be comparatively small because of the comparatively large penetration depth of the silicide. As a result, current concentrations occur at the area of the lowest series resistance, which results in an unacceptable deterioration of the protection properties.

FIG. 5 shows the situation arising when a measure according to the invention is used. In this case, the metal silicide 7 extends, in contrast with the situation shown in FIG. 4, onto the field oxide 2 adjoining the active zone 4. This is possible only when, as will be explained more fully hereinafter, the metal was covered with amorphous silicon during the silicide formation. As a result the metal has in the proximity of the field oxide a considerably smaller penetration depth into the monocrystalline silicon of the region 5. Therefore, the interface between the metal and the adjoining underlying silicon is much more regular and is also farther from the interface between the subregions 4A and 4B so that the series resistance also increases. Both factors contribute to a considerable reduction of the aforementioned disadvantages or even elimination of them.

The semiconductor device described above can be manufactured according to the invention in the following manner (see FIGS. 6 to 9).

The starting material is a P-type silicon substrate 5. As has already been stated above, the substrate 5 may be constituted either by a silicon wafer as a whole or by an epitaxial P-type silicon layer formed on a carrier body. This substrate 5 is provided with a field oxide pattern in a usual manner. In this embodiment, the sunken oxide pattern 2 is provided in known manner while using nitride masking, etching and heating. See FIG. 6.

After the thin "gate oxide" required for the gate electrode structures with the polycrystalline silicon pattern on it for the gate electrodes has been provided, first the zones 3B, 4B and the remaining lightly doped source and drain zones (10B, 11B) of the MOS transistors are formed by implantation of phosphorus ions at a dose of, for example, $4 \times 10^{13}$ ions/cm$^2$ and an energy of, for example, 80 keV followed by a drive-in heat treatment. Subsequently, after oxide "spacers" 20 (cf. FIG. 3) have been provided by deposition of an oxide layer and then back-etching by reactive ion etching (RIE), the n+ zones 3A, 4A, 10A, 11A are formed by implantation of, for example, arsenic ions at 100 keV and a dose of, for example, $5 \times 10^{15}$ ions/cm$^2$ and by another drive-in step. After the thin oxide formed during the preceding steps has been etched away, the situation of the region within the dotted line of FIG. 3 is that shown in FIG. 6.

Figure 7:
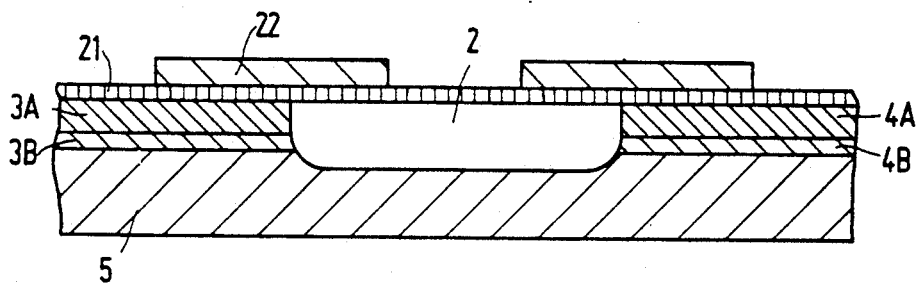
Figure 8:
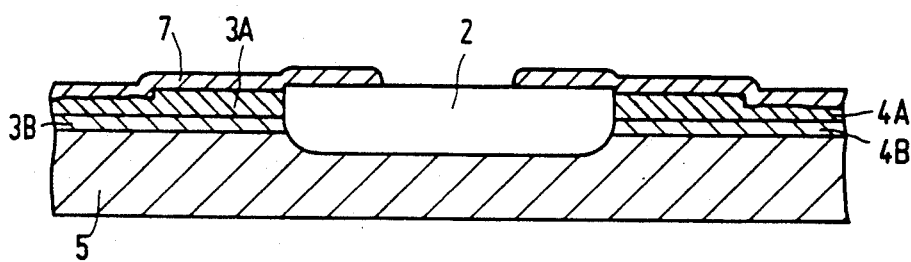

By sputtering, a metal layer of a titanium layer 21 having a thickness of 40 nm, and an amorphous silicon layer 22 having a thickness of 100 nm, are now successively deposited. By masking and etching, the amorphous silicon 22 is now etched into a pattern which extends both above the active zone 3, the active zone 4 and above the field oxide 2. Thus, the situation shown in FIG. 7 is obtained. It should further be noted, that the amorphous silicon, which is located in the drawing only above a part of the zones 3 and 4, may also extend above the whole surface of these zones.

Subsequently, a heat treatment is carried out in nitrogen at about 675° C. for about 30 seconds. During this treatment, the titanium not covered with amorphous silicon is wholly converted into titanium nitride, while the titanium covered with amorphous silicon 22 is converted into titanium silicide 7. The amorphous silicon layer 22 is converted entirely into titanium silicide, but the monocrystalline silicon of the regions 3A and 4A underlying the titanium 21 is converted only over a small depth into titanium silicide. This is due to the fact that the amorphous silicon reacts much more rapidly with titanium than the monocrystalline silicon.

The titanium nitride previously formed is now removed by wet etching in a mixture of H$_2$O$_2$, NH$_3$ and H$_2$O, whereupon a second heat treatment is carried out at a higher temperature (about 875° C.) to convert the titanium silicide, which initially has a metastable C49 structure, into the stable C54 structure. The situation is now that shown in FIG. 8.

Figure 9:
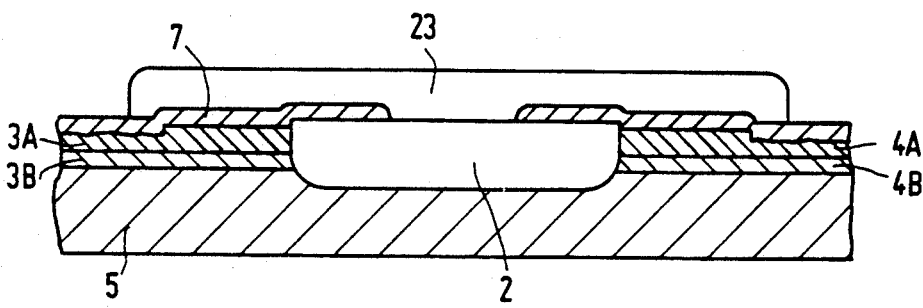

A pyrolytic (CVD) oxide layer 23 is then deposited, into which contact holes are etched in the usual manner. Thus, the situation of FIG. 9 is obtained. Finally, after the metallization 24 of, for example, aluminium has been provided, the situation of FIG. 5 is attained. In this embodiment, the distance a (see FIG. 5) is 0.9 μm, the distance b is 0.5 μm and the distance c is 1.0 μm. The "shallow" titanium silicide therefore extends 1 μm beyond the boundary of the field oxide 2 so that practically the whole transistor current flows through the shallow regularly formed silicide.

Since elsewhere in the integrated circuit through-connections over the field oxide mostly have to be formed by means of layer parts of amorphous silicon provided on the metal, the invention may be used without additional masking and alignment steps being necessary.

The invention is not limited to the embodiment described. For example, the configuration of the protection element may be different from that in the embodiment shown. Instead of a lateral transistor, for example, a protection diode may also be used. The latter can be obtained when in FIG. 5 the zone (4A, B) has the same conductivity type as the region 5. Further, if desired, metals other than titanium may be used. In the embodiment described, the conductivity types may also be replaced (all simultaneously) by the opposite types.

We claim:

1. A semiconductor device having an electrostatic charge protector comprising:
   (a) a semiconductor body of silicon of a first conductivity type,
   (b) at least one monolithic integrated circuit disposed in said semiconductor body,
   (c) a field oxide pattern disposed to separate at least portions of said integrated circuit,
   (d) at least one protection element having at least one active zone of a second conductivity type, said at least one protection element being disposed to adjoin said field oxide pattern at least in part opposite to said integrated circuit, and said at least one protection element having a pn junction with said semiconductor body, and
   (e) a metal silicide electrode layer disposed in contact both with said at least one active zone and with said field oxide pattern to protect against electrostatic discharge, said metal silicide electrode layer being disposed on said field oxide pattern for a given distance of at least 0.5 μm from an edge with said at least one active zone and being disposed on said at least one active zone for a second given distance of about 1.0 μm from said edge,
   wherein electrostatic discharge is prevented by said metal silicide electrode layer and said at least one protection element, and
   wherein said protection element includes two active zones separated by said field oxide pattern, and wherein said metal silicide electrode layer is disposed onto said field oxide pattern from opposite sides with a separation of about 0.9 μm.

2. A semiconductor device according to claim 1, wherein said metal electrode layer is titanium silicide.

3. A semiconductor device according to claim 1, wherein said metal silicide electrode layer is disposed to maintain an increased distance from said pn junction.

4. A semiconductor device according to claim 1, wherein said at least one protection element is a bipolar transistor.

5. A semiconductor device according to claim 4, wherein at least two of said active zones are disposed with respect to said bipolar transistor, said two active zones respectively constituting a collector zone and an emitter zone of a lateral bipolar transistor.

6. A semiconductor device according to claim 1, wherein the active zone of said at least one protection element is part of a diode, said diode providing electrostatic protection upon temporary connection in a reverse direction during operation.

7. A semiconductor device according to claim 1, wherein each of said at least one active zones includes a first weakly doped region in contact with said pn junction and a second highly doped region in contact with said metal silicide electrode layer, said first and second regions being disposed together.

* * * * *